United States Patent
Wu et al.

(10) Patent No.: US 7,812,661 B2
(45) Date of Patent: Oct. 12, 2010

(54) ELECTRONIC SYSTEM CAPABLE OF COMPENSATING PROCESS, VOLTAGE AND TEMPERATURE EFFECTS

(75) Inventors: Mao-Lin Wu, Hsinchu County (TW); Chih-Hung Shen, Chung-Ho (TW); Yu-Ping Ho, Kao-Hsiung Hsien (TW)

(73) Assignee: Mediatek Inc., Hsin-Chu (TW)

( * ) Notice: Subject to any disclaimer, the term of this patent is extended or adjusted under 35 U.S.C. 154(b) by 97 days.

(21) Appl. No.: 11/859,844

(22) Filed: Sep. 24, 2007

(65) Prior Publication Data
US 2009/0079492 A1   Mar. 26, 2009

(51) Int. Cl.
*H01L 35/00*   (2006.01)
(52) U.S. Cl. .................. 327/513; 327/509
(58) Field of Classification Search ......... 327/512–513, 327/509, 362
See application file for complete search history.

(56) References Cited

U.S. PATENT DOCUMENTS

| | | | |
|---|---|---|---|
| 4,746,879 A * | 5/1988 | Ma et al. | 331/44 |
| 4,789,976 A | 12/1988 | Fujishima | |
| 4,851,792 A * | 7/1989 | Ochiai et al. | 331/176 |
| 5,648,766 A * | 7/1997 | Stengel et al. | 340/870.39 |
| 6,297,685 B1 | 10/2001 | Ewen et al. | |
| 6,844,755 B2 * | 1/2005 | Ajit | 326/32 |
| 7,449,972 B2 * | 11/2008 | Juang et al. | 331/182 |
| 7,583,151 B2 * | 9/2009 | Fan et al. | 331/15 |
| 7,590,392 B2 * | 9/2009 | Navaratnam et al. | 455/103 |
| 2003/0201817 A1 | 10/2003 | Watanabe et al. | |
| 2006/0091385 A1 | 5/2006 | Mair et al. | |

FOREIGN PATENT DOCUMENTS

EP   0477088   9/2009

OTHER PUBLICATIONS

EP search report mailed Jun. 22, 2009.

\* cited by examiner

*Primary Examiner*—Dinh T. Le
(74) *Attorney, Agent, or Firm*—Thomas, Kayden, Horstemeyer & Risley

(57) ABSTRACT

An electronic system includes an integrated circuit, powered by a first voltage, with a first device provided therein; a detection device coupled to the first device to detect an output deviation of the first device attributed to process, voltage and temperature (PVT) effects; and a compensation device coupled to the detection device, adjusting the first voltage in response to the output deviation and outputting the first voltage to the integrated circuit to compensate for the PVT effects. The electronic system further comprises a conversion device, coupled between the detection device and the compensation device, to generate an indication signal corresponding to the output deviation for the compensation device to adjust the first voltage. In addition, the compensation device may compare and amplify a difference between a voltage level of the indication signal and a reference to linearly adjust the first voltage for compensating for the PVT effects.

8 Claims, 4 Drawing Sheets

ELECTRONIC SYSTEM CAPABLE OF COMPENSATING PROCESS, VOLTAGE AND TEMPERATURE EFFECTS

BACKGROUND OF THE INVENTION

1. Field of the Invention

The present invention relates to an electronic system, and in particular relates to an electronic system capable of compensating for process, voltage and temperature (PVT) effects with simple and low cost circuitry design.

2. Description of the Related Art

Output signals of electronic systems such as integrated circuits, lump circuits or combination thereof are distorted in response to temperature variations, such that electrical characteristics (voltage, current and so on) and timings such as setup/hold times may deviate or drift from the expected values of original designs, resulting in system malfunction. Generally, engineers perform chamber burn-out tests to electronic products to identify whether designed firmware parameters conform with operational requirements at high/low temperature surroundings. Designing electronic products based on tested firmware parameters, does not necessary guarantee operational stability, especially when operating in different surroundings or with other peripheral conditions. If iterative modified tests are required, test time and fabrication costs would increase. In addition to the above mentioned temperature fluctuation effect, electronic products, especially integrated circuits, may also suffer from process/voltage deviation effects, for example, when fabricated by different processes.

BRIEF SUMMARY OF INVENTION

The invention is directed to an electronic system capable of compensating for process, voltage and temperature (PVT) effects with simple and low cost circuitry design.

An embodiment of the invention proposes an electronic system comprising: an integrated circuit which is powered by a first voltage and has a first device provided therein; a detection device coupled to the first device to detect an output deviation of the first device attributed to process, voltage and temperature (PVT) effects; and a compensation device coupled to the detection device, adjusting the first voltage in response to the output deviation and outputting the first voltage to the integrated circuit to compensate for the PVT effects. Also, the electronic system further comprises a conversion device, coupled between the detection device and the compensation device. The conversion device generates an indication signal corresponding to the output deviation detected by the detection device for the compensation device to adjust the first voltage. In addition, the compensation device may compare and amplify a difference between a voltage level of the indication signal and a reference to linearly adjust the first voltage for compensating for the PVT effects.

Another embodiment of the invention proposes an electronic system comprising: a thermal sensor to monitor temperature of the electronic system or the integrated circuit; a voltage regulator adjusting voltage level of the second source according to a sensing result of the thermal sensor; and an integrated circuit powered by a second source. The thermal sensor is a thermister with resistance changed in response temperature.

A detailed description is given in the following embodiments with references to the accompanying drawings.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
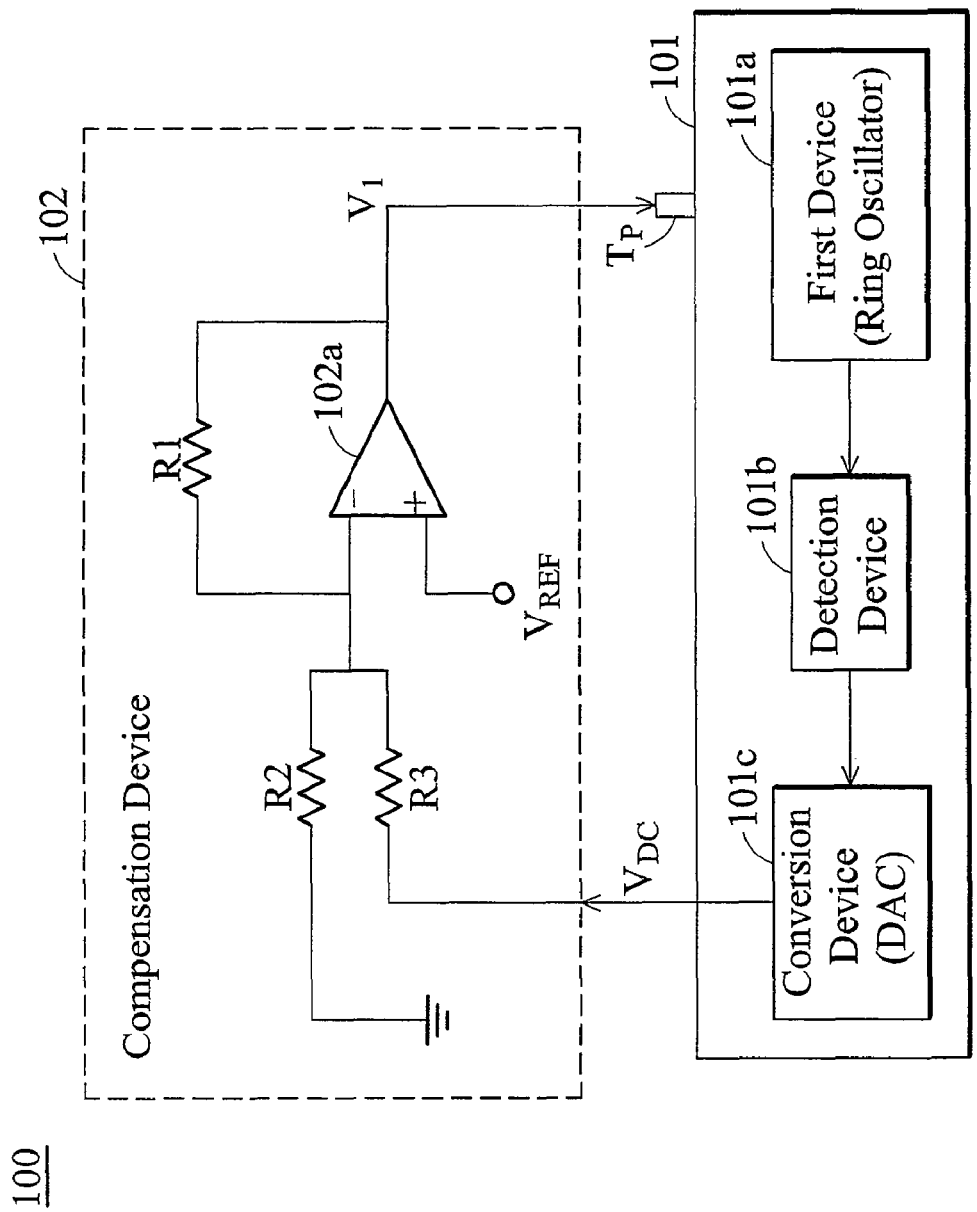
FIG. 1A schematically shows circuit block diagrams of an electronic system 100 according to an exemplary embodiment of the invention.

FIG. 1A schematically shows circuit block diagrams of an electronic system 100 according to an exemplary embodiment of the invention. In FIG. 1A, the electronic system 100 comprises an integrated circuit 101, a first device 101a, a detection device 101b, a conversion device 101c and a compensation device 102. The integrated circuit 101 receives a first voltage $V_1$ at its power terminal $T_p$. The integrated circuit 101 may have a power module (not shown in FIG. 1A) provided therein to perform power management and device driving.

The first device 101a provided inside the integrated circuit 101, for example, is a ring oscillator which is designed to output a predetermined frequency and voltage. The output frequency (or voltage) of the ring oscillator (first device) 110a may be distorted due to process, voltage and temperature (PVT) effects, thus resulting in output deviation from the predetermined frequency (or voltage) for the ring oscillator 101a. Please note that the PVT effects in this invention are defined to reflect the influence of one or more of process, voltage, and temperature deviation. The detection device 101b, provided inside the integrated circuit, is coupled to the first device 101a to detect the output deviation of the first device 110a attributed to the PVT effects. In this embodiment, the detection device 101b may comprise a frequency counter, for example, but is not limited thereto, to determine frequency deviation from the predetermined frequency to the actual frequency output of the ring oscillator 101a. Here, the detection device 101b may output digital data of a deviation counting number in response to the frequency deviation, for example.

The conversion device 101c receives the digital data from the detection device 101b and converts the digital data to an indication signal corresponding to the frequency deviation. Here, the conversion device 101c may be a digital-to-analog converter (DAC), converting the digital data to a direct current (DC) voltage $V_{DC}$. Next, the compensation device 102 receives the DC voltage $V_{DC}$ and adjusts the first voltage $V_1$ in response to the frequency deviation of the ring oscillator 101a and outputs the adjusted first voltage $V_1$ to the integrated circuit 101 to compensate the PVT effects.

The compensation device 102 may compare and amplify a weighted difference (i.e., $\alpha \times V_{DC} - \beta \times V_{REF}$) between the DC voltage $V_{DC}$ of the indication signal and a reference voltage $V_{REF}$ to linearly adjust the first voltage $V_1$. For example, the compensation device 102 may comprise an operational amplifier 102a, resisters R1, R2 and R3 as depicted in FIG. 1A, but is not limited thereto. The first voltage $V_1$ is determined according to the DC voltage $V_{DC}$, the reference voltage $V_{REF}$ and the amplification ratio is dependant upon R1 and R2, respectively. The operational amplifier 102a is used to ensure that sufficient driving voltage (i.e., $V_1$) and driving current can be provided to the integrated circuit 101.

Figure 1B:
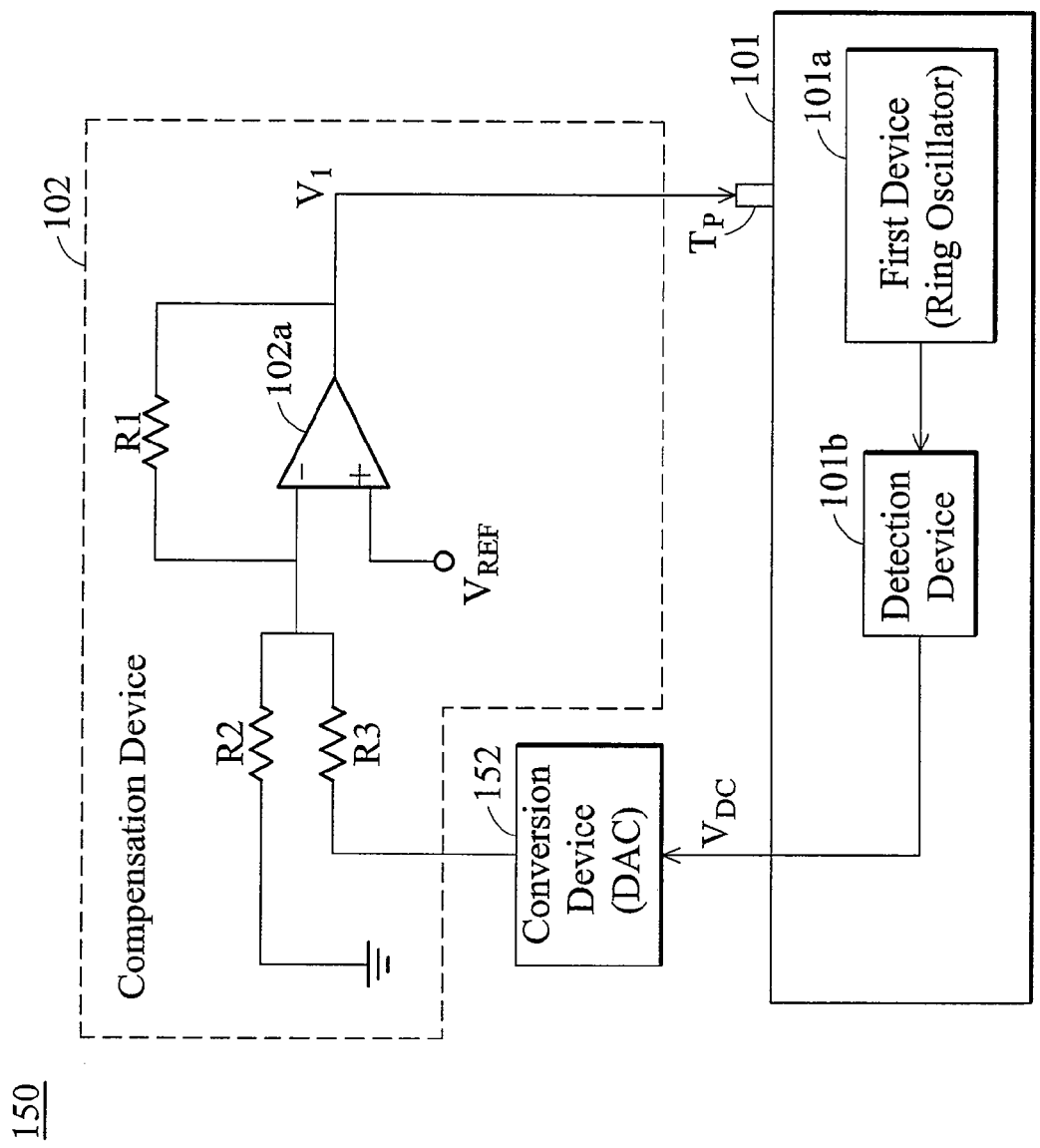
FIG. 1B schematically shows circuit block diagrams of an electronic system 150 according to another exemplary embodiment of the invention.

In FIG. 1A, the first device 101a, the detection device 101b and the conversion device 101c are provided inside of the integrated circuit 101. Alternatively, the conversion device (DAC) can be provided outside of the integrated circuit 101. FIG. 1B schematically shows circuit block diagrams of an electronic system 150 according to another exemplary embodiment of the invention. The electronic system 150 comprises an external conversion device (DAC) 152 provided outside of the integrated circuit 101. The electronic system 150 has the same functions and operations as that of the electronic system 100 described above. In FIG. 1B, the detection device 101b may communicate with the external ADC 152 through parallel interface, serial interface or I²C interface.

Figure 2:
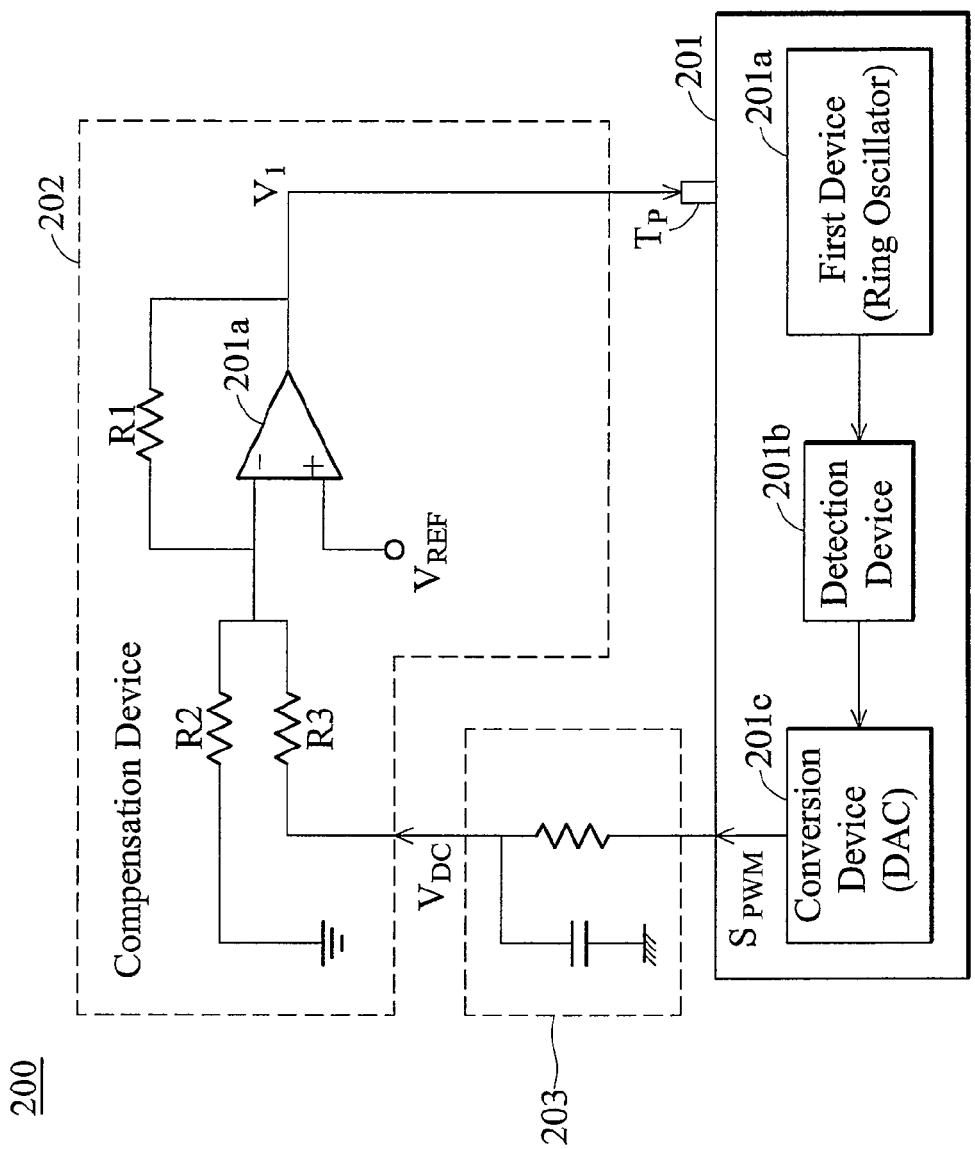
FIG. 2 schematically shows circuit block diagrams of an electronic system 200 according to yet another exemplary embodiment of the invention.

FIG. 2 schematically shows circuit block diagrams of an electronic system 200 according to yet another exemplary embodiment of the invention. In FIG. 2, the electronic system 200 comprises an integrated circuit 201, a first device 201a, a detection device 201b, a conversion device 201c, a low-pass filter 203 and a compensation device 202. The integrated circuit 201 receives a first voltage V1 at its power terminal Tp. The integrated circuit 201 may have a power module (not shown in FIG. 2) provided therein to perform power management and drive devices. In FIG. 2, the first device 201a and the detection device 201b have the same functions and features as that of the first device 101a and detection device 101b of FIG. 1A, therefore further description will not be provided for brevity.

The first device 201a provided inside the integrated circuit 201, for example, is a ring oscillator which is designed to output a predetermined frequency and voltage. The detection device 201b, provided inside the integrated circuit 201, is coupled to the first device 201a to detect an output deviation of the first device 201a attributed to the PVT effects. Also, the detection device 201b determines frequency deviation from the predetermined frequency to the actual frequency output of the ring oscillator 201a.

The conversion device 201c receives and converts the frequency deviation determined by the detection device 201b to an indication signal. Here, for example, the conversion device 201c is a pulse width modulation device (PWM), outputting PWM signal $S_{PWM}$ as the indication signal according to the frequency deviation. The PWM signal $S_{PWM}$ has a PWM frequency PWM_f and a PWM duty PWM_d defined as follows: PWM_f=CLK_ref/256×pwmp, and PWM_d=Cal_Cnt/256, where CLK_ref is a frequency of a reference clock, pwmp and Cal_Cnt are control variables (both within the range of 1~256, controlled through a software, for example), and the numeral 256 means 8-bit resolution or control scale. In this embodiment, the PWM device 201c adjusts the variable pwmp or Cal_Cnt to specify the output frequency or duty of the PWM signal respectively so as to response to the frequency deviation. Therefore, the conversion device 201c can output PWM signal $S_{PWM}$ with 256 different duty cycles (or different frequency) to identify the frequency deviation.

The low-pass filter 203 is a RC network made of resistors and capacitors. The low-pass filter 203 filters the PWM signal $S_{PWM}$ via RC charging/discharging to obtain a direct current (DC) voltage $V_{DC}$. The level of the DC voltage $V_{DC}$ is in proportion to the duty of the PWM signal $S_{PWM}$.

The compensation device 202 has the same function and structure as that of the compensation device 102, thus further description will not be provided for brevity. The compensation device 202 may compare and amplify a weighted difference between (or in relation with) the DC voltage $V_{DC}$ of the indication signal and a reference voltage $V_{REF}$ to linearly adjust the first voltage $V_1$. The first voltage $V_1$ is determined according to the reference voltage $V_{REF}$ and the amplification ratio R1/R2. The operational amplifier 201a ensures sufficient driving voltage (i.e., $V_1$) and driving current is provided to the integrated circuit 201. The DC voltage $V_{DC}$ comprises 256 different levels corresponding to 256 different frequency deviations. Therefore, the compensation device 202 can linearly adjust the first voltage using 256 scales, improving compensating accuracy and adjustable range.

Figure 3:
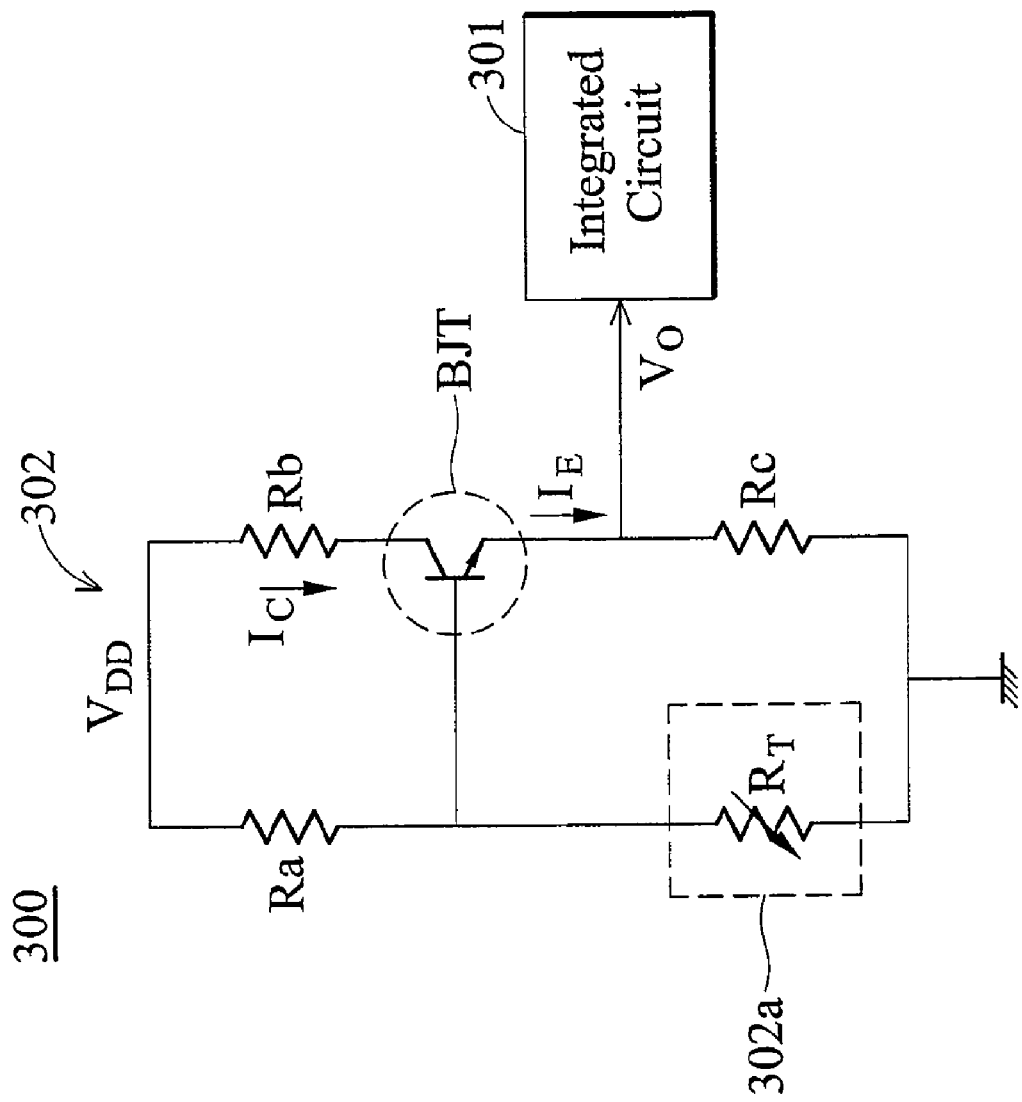
FIG. 3 schematically shows circuit block diagrams of an electronic system 300 according to yet another further exemplary embodiment of the invention.

FIG. 3 schematically shows circuit block diagrams of an electronic system 300 according to yet another further exemplary embodiment of the invention. The electronic system 300 comprises a voltage regulator 302 and an integrated circuit 301. The voltage regulator 302 is coupled to a main power source $V_{DD}$ to output a second source Vo to the integrated circuit, and comprises a thermal sensor 302a to monitor temperature of the electronic system 300 or the integrated circuit 301. The voltage regulator 302 adjusts voltage level of the second source Vo according to the sensing result of the thermal sensor 302a to compensate for temperature effect. In this embodiment, the voltage regulator 302 comprises an NPN bipolar junction transistor BJT (or other type of transistor), resistors Ra~Rc and a thermister $R_T$ serving as the thermal sensor 302a. When temperature changes, the resistance of the thermister $R_T$ changes in response to temperature changes. Emitter current $I_E$ of the transistor BJT is changed in response to resistance change of the thermister $R_T$. The second source Vo equals $I_E \times Re$, where resistance Re means equivalent resistance of the internal impedance of the BJT emitter, resister Re, and load of the integrated circuit 301. Consequently, the second source Vo changes in response to the temperature change detected by the thermal sensor 302a, thereby compensating for the temperature effect. The transistor BJT may be operated in a linear amplification zone, whereby the electronic system is capable of adjusting the second source Vo linearly, having flexible control and being appropriate for practical requirements.

The voltage regulator 302 can be provided to the electronic system 100, 150 or 200 described above. For example, the voltage regulator 302 can output the second source Vo to the power terminal T of the integrated circuit, to provide compensation for ambient temperature of the electronic system or the integrated circuit.

In view of above descriptions in FIGS. 1A, 1B and 2, the embodiments of the invention may provide one or more of the following advantages: (1) being capable of outputting control signals to compensate for detected PVT effects, (2) linearly indicating the output deviation and compensate for the PVT effects, (3) being controlled by software and improving compensating accuracy, and (4) only requiring a simple circuitry design (using RC charging/discharging structure or DAC) with low cost. In view of above descriptions in FIG. 3, the embodiment of the invention has the following advantages of:

(1) automatically detecting temperature by a thermal sensor, (2) linearly indicating the output deviation and compensating for the PVT effects, and (3) only requiring a simple hardware solution.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic system comprising:
an integrated circuit powered by a first voltage, comprising a first device generating a desired output;
a detection device coupled to the first device to detect an output deviation of the first device, from the desired output, and the deviation output attributed to process, voltage and temperature (PVT) effects;
a compensation device coupled to the detection device, adjusting the first voltage in response to the output deviation and outputting the first voltage to the integrated circuit to compensate the PVT effects; and
a conversion device, coupled between the detection device and the compensation device, which generates an indication signal corresponding to the output deviation detected by the detection device for the compensation device to adjust the first voltage,
wherein the compensation device compares and amplifies a difference between a voltage level of the indication signal and a reference voltage to adjust the first voltage.

2. The electronic system as claimed in claim 1, wherein the detection device outputs digital data as the indication signal in response to the output deviation, and the conversion device comprises a digital-to-analog converter converting the digital data to the indication signal for the compensation device.

3. The electronic system as claimed in claim 2, wherein the digital-to-analog converter is provided either inside of or outside of the integrated circuit.

4. The electronic system as claimed in claim 1, wherein the conversion device comprises a pulse width modulation (PWM) device, and the electronic system further comprises a low-pass filter, the PWM device generating a PWM signal with a duty cycle and frequency correlated with the output deviation, and the low-pass filter filtering the PWM signal to generate the indication signal.

5. The electronic system as claimed in claim 1, wherein the detection device is provided inside of the integrated circuit, and the compensation device is installed outside of the integrated circuit.

6. The electronic system as claimed in claim 1, wherein the first device is a ring oscillator designed to output a predetermined frequency.

7. The electronic system as claimed in claim 1, further comprising a main source to power the electronic system, and a voltage regulator coupled to the main source to output a second source to the integrated circuit, wherein the voltage regulator comprises a thermal sensor to monitor temperature of the electronic system or the integrated circuit, and the voltage regulator adjusts voltage level of the second source according to a sensing result of the thermal sensor.

8. The electronic system as claimed in claim 7, wherein the thermal sensor is a thermister with resistance changed in response temperature.

* * * * *